United States Patent
Zhang et al.

(10) Patent No.: US 11,243,267 B2
(45) Date of Patent: Feb. 8, 2022

(54) GROUND-WALL INSULATION AGING MONITORING AND LOCATING METHOD FOR CONVERTER TRANSFORMER

(71) Applicant: Tsinghua University, Beijing (CN)

(72) Inventors: Pinjia Zhang, Beijing (CN); Geye Lu, Beijing (CN)

(73) Assignee: TSINGHUA UNIVERSITY, Beijing (CN)

(*) Notice: Subject to any disclaimer, the term of this patent is extended or adjusted under 35 U.S.C. 154(b) by 111 days.

(21) Appl. No.: 16/850,740

(22) Filed: Apr. 16, 2020

(65) Prior Publication Data
US 2020/0241081 A1    Jul. 30, 2020

(30) Foreign Application Priority Data
Feb. 6, 2020   (CN) .......................... 201910735878.2

(51) Int. Cl.
| | | |
|---|---|---|
| *G01R 31/00* | (2006.01) | |
| *G01R 31/62* | (2020.01) | |
| *G01R 31/52* | (2020.01) | |
| *G01R 31/28* | (2006.01) | |

(52) U.S. Cl.
CPC ......... *G01R 31/62* (2020.01); *G01R 31/2827* (2013.01); *G01R 31/52* (2020.01)

(58) Field of Classification Search
USPC ................................ 324/509, 551, 545, 547
See application file for complete search history.

(56) References Cited

U.S. PATENT DOCUMENTS

| | | | | |
|---|---|---|---|---|
| 2014/0176152 A1* | 6/2014 | Wolbank | ............ | G01R 31/1227 324/510 |
| 2020/0083702 A1* | 3/2020 | Zeng | ...................... | H02H 9/002 |

\* cited by examiner

*Primary Examiner* — Vincent Q Nguyen
(74) *Attorney, Agent, or Firm* — Dragon Sun Law Firm, PC; Jinggao Li, Esq.

(57) ABSTRACT

Disclosed is a ground-wall insulation aging monitoring and locating method for a converter transformer. A neutral lead of three-phase windings on a valve side of a converter transformer is adjusted, an insulation leakage current of a certain phase winding on the valve side before aging is measured, a common-mode component and a differential-mode component in the insulation leakage current before aging are extracted, and a common-mode equivalent capacitance and a differential-mode equivalent capacitance before aging are calculated; a common-mode equivalent capacitance and a differential-mode equivalent capacitance after aging are calculated in the same way.

14 Claims, 6 Drawing Sheets

GROUND-WALL INSULATION AGING MONITORING AND LOCATING METHOD FOR CONVERTER TRANSFORMER

CROSS-REFERENCE TO RELATED PATENT APPLICATION

This application claims priority to and the benefit of CN201910735878.2, filed Feb. 6, 2020, entitled "GROUND-WALL INSULATION AGING MONITORING AND LOCATING METHOD FOR CONVERTER TRANSFORMER," by Pinjia Zhang et al. The entire disclosure of the above-identified application is incorporated herein by reference.

Some references, which may include patents, patent applications, and various publications, are cited and discussed in the description of the present disclosure. The citation and/or discussion of such references is provided merely to clarify the description of the present disclosure and is not an admission that any such reference is "prior art" to the present disclosure described herein. All references cited and discussed in this specification are incorporated herein by reference in their entireties and to the same extent as if each reference was individually incorporated by reference.

TECHNICAL FIELD

The present invention relates to the technical field of insulation monitoring of power transformers in converter systems, and more particularly, to a ground-wall insulation aging monitoring and locating method for a converter transformer based on characteristic harmonics of a converter valve.

BACKGROUND

Power electronic system is evolving rapidly with the large-scale integration of converter-energized applications, such as renewable energy resources and variable-speed industrial loads. As a core equipment for connecting a DC grid to an AC grid, a converter transformer is required to be operated reliably to ensure reliable electric energy transmission and the safety of the whole power system. However, field failures of converter transformers are often reported since the implemented monitoring and protecting means do not operate properly. Researches have shown that the failures are usually evolved from insulation aging of a component inside the converter transformer. In practice, many monitoring techniques have been utilized to online monitor an insulation condition of the converter transformer, but these techniques are designed and developed mainly for traditional power-frequency transformers, generally needing an additional expensive, intrusive measuring device, and having problems of insufficient sensitivity and relatively poor repeatability. For example, the performance of a partial discharge detection method often depends on installation locations of sensors. Moreover, due to immense interferences in ambient with similar features of partial discharges, the monitoring sensitivity and accuracy can be adversely affected. In other words, in the field of an AC/DC hybrid electric converter system field, pulse signals are more complex features, while a traditional discharge detection method may lack the capability of identifying all partial discharge features of the converter transformer.

Figure 1:
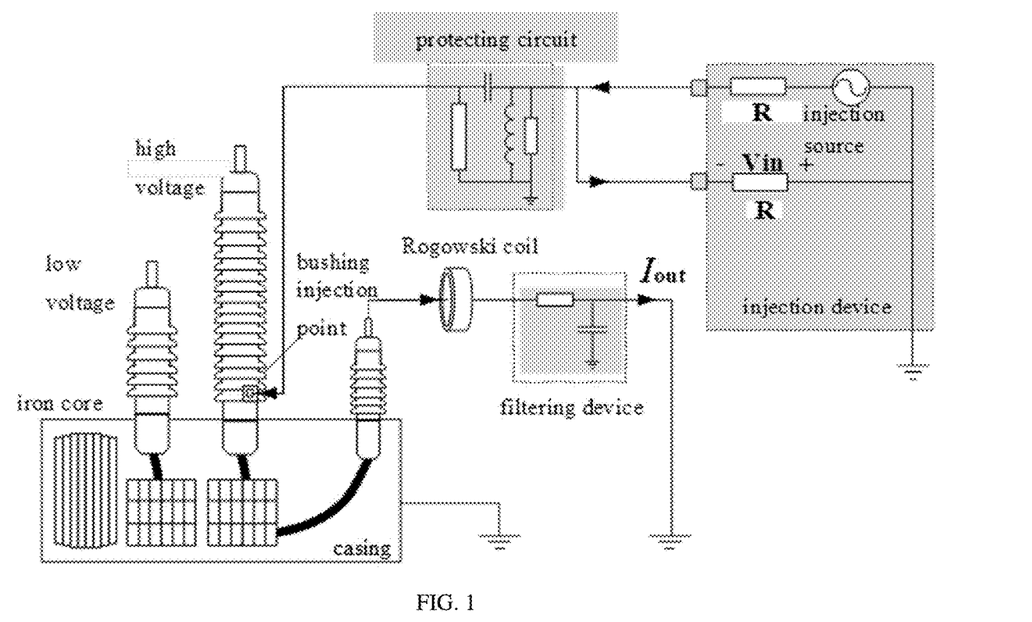
FIG. 1 is a device that uses an online frequency response method to monitor insulation impedance of a transformer in the prior art.
Figure 2:
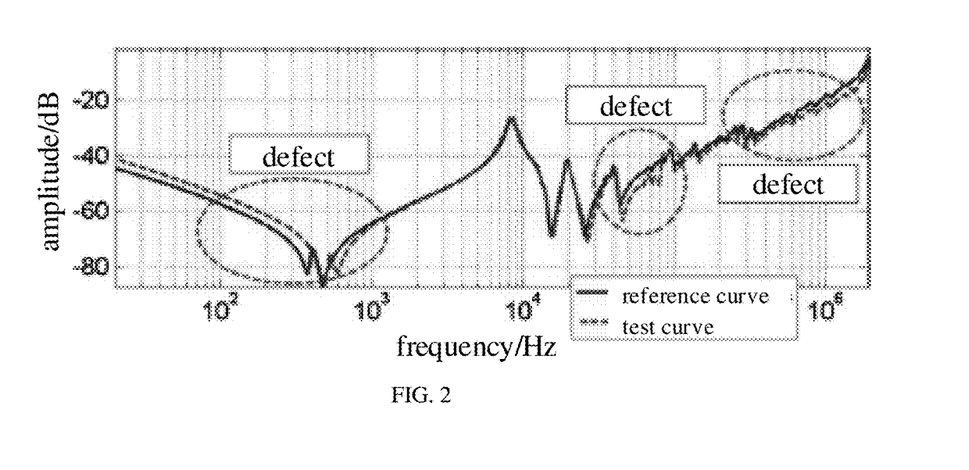
FIG. 2 is a frequency response curve of the insulation impedance in the prior art.

In the prior art, there is a type of insulation-impedance-based technique that is designed for monitoring traditional power-frequency transformer. The insulation impedance was monitored in a specific frequency band. In the method, an excitation signal was injected by using an extra injection device, or was coupled with the transformer system through a bushing capacitor. The prior art was described by an example of the bushing capacitor coupling injection, and the schematic diagram of the monitoring principle was shown in FIG. 1. The injection device was connected to a tap out of the bushing through a protecting circuit. The injection voltage Vi, was measured. A neutral lead was grounded through a filtering device, and a Rogowski coil was installed to measure the current $I_{out}$ of the neutral lead. According to the measured voltage and current, the impedance at the specified frequency ($\omega$) was calculated, that is, $Z(\omega)=V_{in}(\omega)/I_{out}(\omega)$; and a frequency response curve of the calculated impedance Z in the specified frequency band was drawn, as shown in FIG. 2. Once the transformer insulation aged, the amplitude of the curve would change. In addition, the resonances of the curve would shift horizontally and vertically. On the basis of field experience, this method could quantitatively analyze the changes of the insulation parameters of the transformer and figure out a defect type. However, this technique has the following shortcomings: 1) an injection device, a measuring circuit and a protecting circuit are required, which increases the monitoring cost; 2) the performance is affected by the load fluctuations; and 3) it is difficult to quantify the degree of insulation aging, since the monitoring result is evaluated according to amplitude change and resonance shift.

In the prior art, online insulation monitoring methods based on amounts of both voltage and current have been widely studied. These methods include a capacitance and dissipation factor (C/DF) test method, a sweep frequency response analysis (SFRA) method, an impulse frequency response analysis (IFRA) method, etc. These methods have been verified by laboratory tests that have the potential in on-line monitoring of the insulation of the transformer. However, there are the following problems. 1) The C/DF test method effectively reflects the insulation aging in a low frequency band (<1 Hz). It generally requires a long test time, and the performance is dependent on complex operation conditions during the test. As a result, it increases the difficulty in evaluation and quantification of the response performance once environmental conditions (such as temperature and humidity) are changed. 2) The SFRA method is based on the impedance response of the transformer system in a wide frequency band, and usually requires an additional injection device and protecting circuit; and the test results are dependent on power grid fluctuations and harmonics, causing data processing to be more complicated. 3) The IFRA method uses inherent transient pulses in the power system to obtain the response in an ultra-high frequency band, but the test results are poor in repeatability and difficult to quantify the insulation aging degree, and high-sampling-rate hardware equipment is required. As a result, the above methods are not widely used in the online monitoring of the insulation condition of the transformer due to the above engineering difficulties. In addition, as the field environment of the converter transformer is complex, the application of the above methods in online monitoring of the insulation condition of the converter transformer will be adversely affected by harmonics, temperature, moisture, and other ambient interferences, etc.

Based on the above analysis, there is an urgent need for an online non-invasive insulation monitoring method specialized for a converter transformer to robustly assess a ground-wall insulation aging condition of the converter transformer, grasp the operation conditions of the converter transformer in real time, effectively reduce a failure rate, and promote safe, economical and high-quality operation of the converter system.

Therefore, a heretofore unaddressed need exists in the art to address the aforementioned deficiencies and inadequacies.

SUMMARY

An objective of the present invention is to provide a ground-wall insulation aging monitoring and locating method for a converter transformer based on characteristic harmonics of a converter valve. The method employs a non-intrusive, economical, and convenient testing manner. Therefore, there is no need for additional test devices. As the test result is unaffected by changeable system operating conditions and load fluctuations, the monitoring performance is robust. Meanwhile, there is provided a ground-wall insulation monitoring method for the converter transformer, so that insulation conditions can be effectively quantified and evaluated.

The present invention is implemented by the following technical solutions.

A ground-wall insulation aging monitoring and locating method for a converter transformer includes the following steps:

adjusting a connection of neutral leads of three-phase windings on a valve side of the converter transformer;

measuring an insulation leakage current of a certain phase winding on the valve side before aging;

extracting a series of common-mode and differential-mode components of the insulation leakage current of the phase winding on the valve side before aging, and calculating the corresponding common-mode and differential-mode equivalent capacitances before aging;

measuring an insulation leakage current of the phase winding on the valve side after aging;

extracting a series of common-mode and differential-mode components of the insulation leakage current of the phase winding on the valve side before aging, and calculating the corresponding common-mode and differential-mode equivalent capacitances after aging; and calculating a ratio of a differential-mode equivalent capacitance difference value to a common-mode equivalent capacitance difference value according to (1) the difference value between the differential-mode equivalent capacitances before and after aging and (2) the difference value between the common-mode equivalent capacitances before and after aging, the ratio representing a ground-wall insulation aging location of the phase winding on the valve side.

Further, the step of adjusting the neutral lead of the three-phase windings on the valve side of the converter transformer includes parallelly arranging an inlet lead of a certain phase winding on the valve side of the converter transformer and a corresponding neutral outlet lead of the phase winding on the valve side.

Further, the step of measuring the insulation leakage current of the certain phase winding on the valve side before aging includes:

installing a current transformer on the certain phase winding on the valve side;

passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding on the valve side is the inlet lead current, and a current flowing through the neutral outlet lead of the phase winding on the valve side is the neutral outlet lead current; and measuring, by the current transformer, the insulation leakage current of the phase winding on the valve side before aging.

Further, an expression for measuring the insulation leakage current of the phase winding on the valve side before aging is:

$$i_{leakA} = i_{pA0} - i_{pAN} = \sum_{x=0}^{N}(i_{pgx} + i_{sgx}), \quad (1)$$

wherein $i_{leakA}$ is the insulation leakage current of the phase winding on the valve side before aging and is measured by the current transformer, $i_{pA0}$ is the inlet lead current before aging, $i_{pAN}$ is the neutral outlet lead current before aging, $i_{pgx}$ is a current flowing through an x-th ground-wall insulation branch circuit of the phase winding on the valve side before aging, $i_{sgx}$ is a current flowing through the x-th ground-wall insulation branch circuit of the phase winding on a grid side before aging, and N+1 is a total number of ground-wall insulation branch circuits of the phase winding.

Further, extracting a series of common-mode and differential-mode components in the insulation leakage current of the phase winding on the valve side before aging and calculating the common-mode and differential-mode equivalent capacitances before aging includes:

extracting the common-mode component at the certain angular frequency having an expression of:

$$\begin{aligned}i_{leakA}^{CM} &= \omega^{CM} C_{pg} \sum_{x=0}^{N} \dot{U}_{pAx}^{CM} + \omega^{CM} C_{sg} \sum_{x=0}^{N} \dot{U}_{sAx}^{CM} \\ &= \omega^{CM}(N+1)\dot{U}_{pA0}^{CM}(C_{pg} + K^{CM}C_{sg}) \\ &\approx \omega^{CM} \dot{U}_{pA0}^{CM} C_{eq}^{CM},\end{aligned} \quad (2)$$

wherein $i_{leakA}^{CM}$ is the common-mode component in the insulation leakage current of the phase winding on the valve side before aging, $\omega^{CM}$ is a common-mode angular frequency, $C_{pg}$ is a capacitance component of a ground-wall insulation branch circuit of the phase winding on the valve side, $C_{sg}$ is a capacitance component of the ground-wall insulation branch circuit of the phase winding on the grid side, $\dot{U}_{pA0}^{CM}$ is a common-mode component of a phase-to-ground voltage at the inlet lead of the phase winding on the valve side before aging, $\dot{U}_{pAx}^{CM}$ is a common-mode component of a phase-to-ground voltage at a winding wire corresponding to the x-th ground-wall insulation branch circuit of the phase winding on the valve side before aging, $\dot{U}_{sAx}^{CM}$ is a common-mode component of the phase-to-ground voltage at the winding wire corresponding to the x-th ground-wall insulation branch circuit of the phase winding on the grid side before aging, N+1 is a total number of the ground-wall insulation branch circuits of the phase winding, $K^{CM}=1+C_{sg}/C_{ps}$, $C_{ps}$ is a capacitance component of an insulation branch circuit between a high-voltage winding and a low-voltage winding, and $C_{eq}^{CM}$ is the common-mode equivalent capacitance before aging;

extracting the differential-mode component at the certain angular frequency having an expression of:

$$\begin{aligned}\dot{i}_{leakA}^{DM} &= \omega^{DM} C_{pg} \sum_{x=0}^{N} \dot{U}_{pAx}^{DM} + \omega^{DM} C_{sg} \sum_{x=0}^{N} \dot{U}_{sAx}^{DM} \\ &= \omega^{DM}\left[(N+1)\dot{U}_{pA0}^{DM} - \frac{N(N+1)}{2}\frac{\dot{U}_{pA0}^{DM}}{N}\right](C_{pg} + K^{DM}C_{sg}) \\ &= \omega^{DM}\frac{N(N+1)\dot{U}_{pA0}^{DM}}{2}(C_{pg} + K^{DM}C_{sg}) \Box \omega^{DM}\frac{\dot{U}_{pA0}^{DM}}{2}C_{eq}^{DM},\end{aligned} \quad (3)$$

$I_{leakA}{}^{DM}$ is the differential-mode component in the insulation leakage current of the phase winding on the valve side before aging, $\omega^{DM}$ is a differential-mode angular frequency, $\dot{U}_{pAx}{}^{DM}$ $\dot{U}_{pA0}{}^{DM}$ is a differential-mode component of the phase-to-ground voltage at the inlet lead of the phase winding on the valve side before aging, $\dot{U}_{pAx}{}^{DM}$ is a differential-mode component of the phase-to-ground voltage at the winding wire corresponding to the x-th ground-wall insulation branch circuit of the phase winding on the valve side before aging, $\dot{U}_{sAx}{}^{DM}$ is a differential-mode component of a phase-to-ground voltage at the winding wire corresponding to the x-th ground-wall insulation branch circuit of the phase winding on the grid side before aging, N+1 is a total number of the ground-wall insulation branch circuits of the phase winding, $K^{DM}$ is ratio of winding turns on the valve side to winding turns on the grid side of the converter transformer, and $C_{eq}{}^{DM}$ is the differential-mode equivalent capacitance before aging; and obtaining the common-mode equivalent capacitance $C_{eq}{}^{CM}$ and the differential-mode equivalent capacitance $C_{eq}{}^{DM}$ before aging according to the expressions (2) and (3) of the extracted common-mode and differential-mode components in the insulation leakage current of the phase winding on the valve side before aging.

Further, the step of measuring the insulation leakage current of the phase winding on the valve side after aging includes:

installing a current transformer on the phase winding on the valve side;

passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding of the valve side is the inlet lead current, and a current flowing through the neutral outlet lead of the phase winding of the valve side is the neutral outlet lead current; and measuring, by the current transformer, the insulation leakage current of the phase winding on the valve side after aging.

Further, an expression for measuring the insulation leakage current of the phase winding on the valve side after aging is:

$$\hat{i}_{leakA} = \hat{i}_{pA0} - \hat{i}_{pAN} = \sum_{x=0}^{N}\left(\hat{i}_{pgx} + \hat{i}_{sgx}\right), \quad (4)$$

wherein $\hat{i}_{leakA}$ is the insulation leakage current of the phase winding on the valve side after aging and is measured by the current transformer, $\hat{i}_{pA0}$ is the inlet lead current after aging, $\hat{i}_{pAN}$ is the neutral outlet lead current after aging, $\hat{i}_{pgx}$ is a current flowing through an x-th ground-wall insulation branch circuit of the phase winding on the valve side after aging, $\hat{i}_{sgx}$ is a current flowing through the x-th ground-wall insulation branch circuit of the phase winding on the grid side after aging, and N+1 is a total number of ground-wall insulation branch circuits of the phase winding.

Further, in the step of extracting common-mode components and differential-mode components in the insulation leakage current of the phase winding on the valve side after aging, expressions of the common-mode component and the differential-mode component in the insulation leakage current after aging respectively are:

$$\begin{cases} \hat{i}_{leakA}^{CM} = i_{leakA}^{CM} + \omega^{CM}\dot{U}_{pAx}^{CM} \cdot \Delta C_{pgx} \\ \hat{i}_{leakA}^{DM} = i_{leakA}^{DM} + \omega^{DM}\left(1 - \frac{x}{N}\right)\dot{U}_{pAx}^{DM} \cdot \Delta C_{pgx} \end{cases}, \quad (5)$$

wherein $\Delta C_{pgx}$ is a variation of capacitance of the x-th ground-wall insulation branch circuit of the phase winding on the valve side after aging, $\hat{I}_{leakA}{}^{CM}$ is the common-mode component in the insulation leakage current of the phase winding on the valve side after aging, and $\hat{I}_{leakA}{}^{DM}$ is the differential-mode component in the insulation leakage current of the phase winding on the valve side after aging.

Further, expressions for calculating common-mode and differential-mode equivalent capacitances after aging are:

$$\begin{cases} \hat{C}_{eq}^{CM} = \frac{\hat{I}_{leakA}^{CM}}{\omega^{CM}\dot{U}_{pA0}^{CM}} = C_{eq}^{CM} + \Delta C_{pgx} \\ \hat{C}_{eq}^{DM} = \frac{2\hat{I}_{leakA}^{DM}}{\omega^{DM}\dot{U}_{pA0}^{DM}} = C_{eq}^{DM} + 2\left(1 - \frac{x}{N}\right)\Delta C_{pgx} \end{cases}, \quad (6)$$

wherein $\hat{C}_{eq}{}^{CM}$ is the common-mode equivalent capacitance after aging, and $\hat{C}_{eq}{}^{DM}$ is the differential-mode equivalent capacitance after aging.

Further, a difference value between the differential-mode equivalent capacitances before and after aging and a difference value between the common-mode equivalent capacitances before and after aging are calculated, and a ratio of the differential-mode equivalent capacitance difference value to the common-mode equivalent capacitance difference value is calculated and has an expression of:

$$\text{Ratio} = \frac{\hat{C}_{eq}^{DM} - C_{eq}^{DM}}{\hat{C}_{eq}^{CM} - C_{eq}^{CM}} = 2\left(1 - \frac{x}{N}\right), \quad (7)$$

wherein a ground-wall insulation aging location of the phase winding on the valve side is obtained according to the ratio.

In summary, the present invention provides the ground-wall insulation aging monitoring and locating method for the converter transformer, and the method employs a non-intrusive, economical, and convenient testing manner.

Therefore, there is no need for additional test devices. As the test result is unaffected by fluctuations of a load in a power grid, the monitoring performance is robust.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

DETAILED DESCRIPTION OF THE INVENTION

In order to explain the objectives, technical solutions and advantages of the present invention more apparently, the present invention is further described in detail below in connection with the specific embodiments with reference to accompanying drawings. It should be understood that these descriptions are merely exemplary and are not intended to limit the scope of the present invention. In addition, in the following description, descriptions of well-known structures and techniques are omitted to avoid unnecessary obscuring of the concepts of the present invention.

Figure 3:
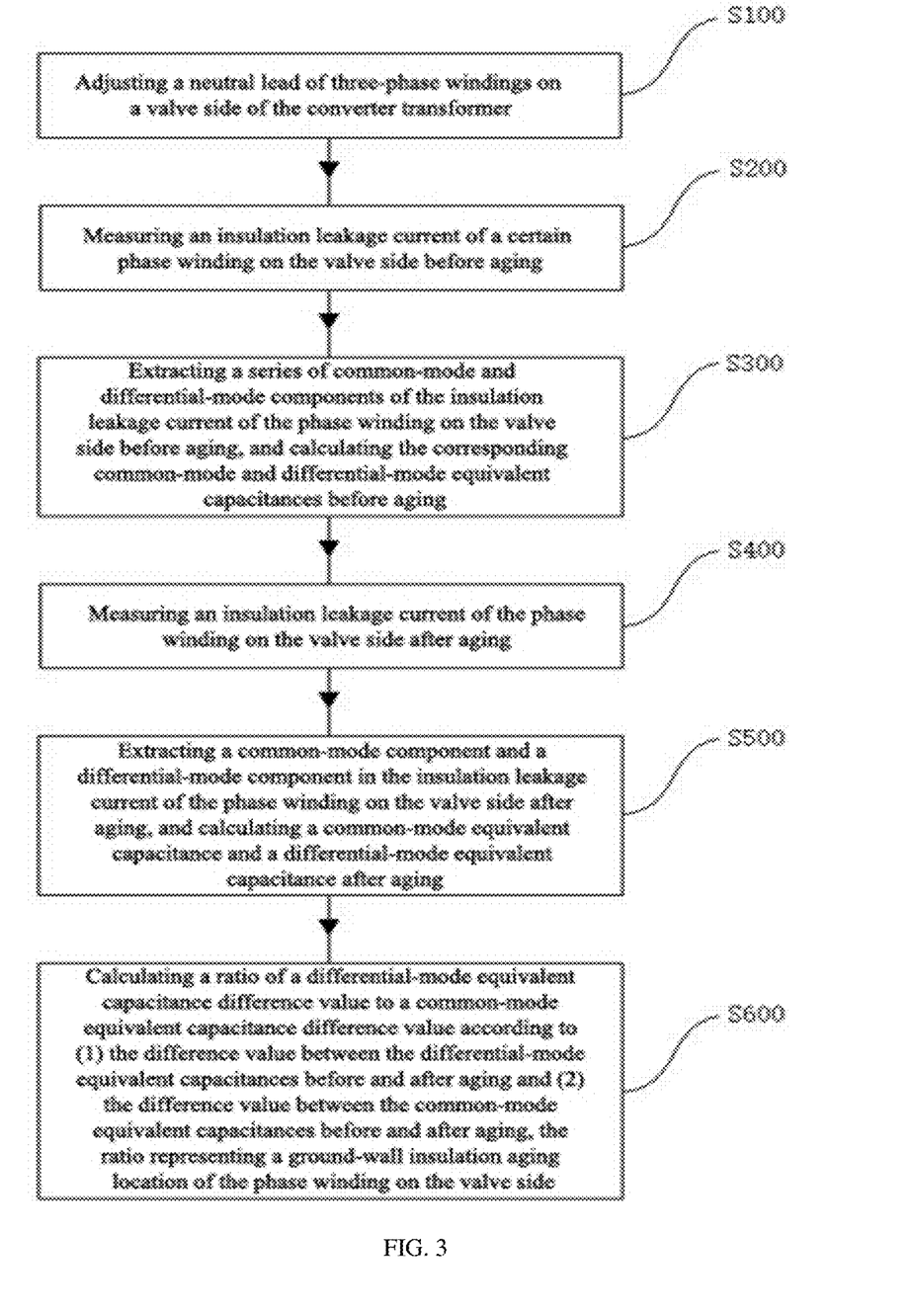
FIG. 3 is a flowchart of a ground-wall insulation aging monitoring and locating method for a converter transformer provided by the present invention.

The present invention provides a ground-wall insulation aging monitoring and locating method for a converter transformer. As shown in FIG. 3, the method provided by the present invention includes the following steps.

In step S100, a neutral lead of three-phase windings on a valve side of the converter transformer is adjusted.

Further, the step of adjusting the neutral lead of the three-phase windings on the valve side of the converter transformer includes parallelly arranging an inlet lead of a certain phase winding on the valve side of the converter transformer and a corresponding neutral outlet lead of the phase winding on the valve side.

In step S200, an insulation leakage current of a certain phase winding on the valve side before aging is measured.

Figure 4:
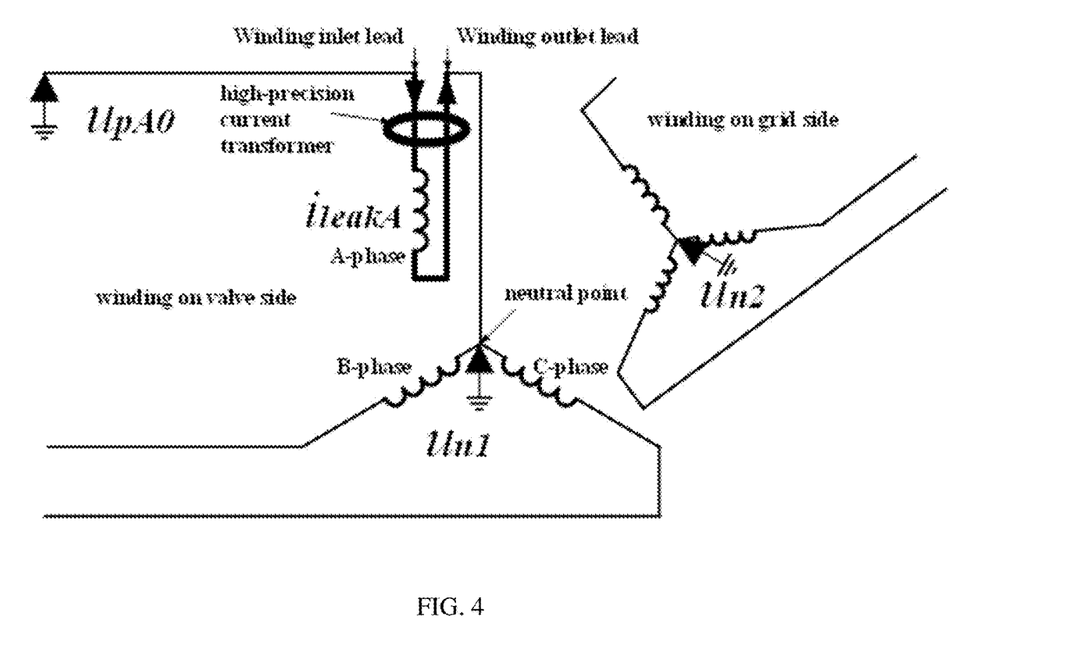
FIG. 4 is a schematic diagram of a connection change manner of neutral leads of windings on a valve side provided by the present invention.
Figure 5:
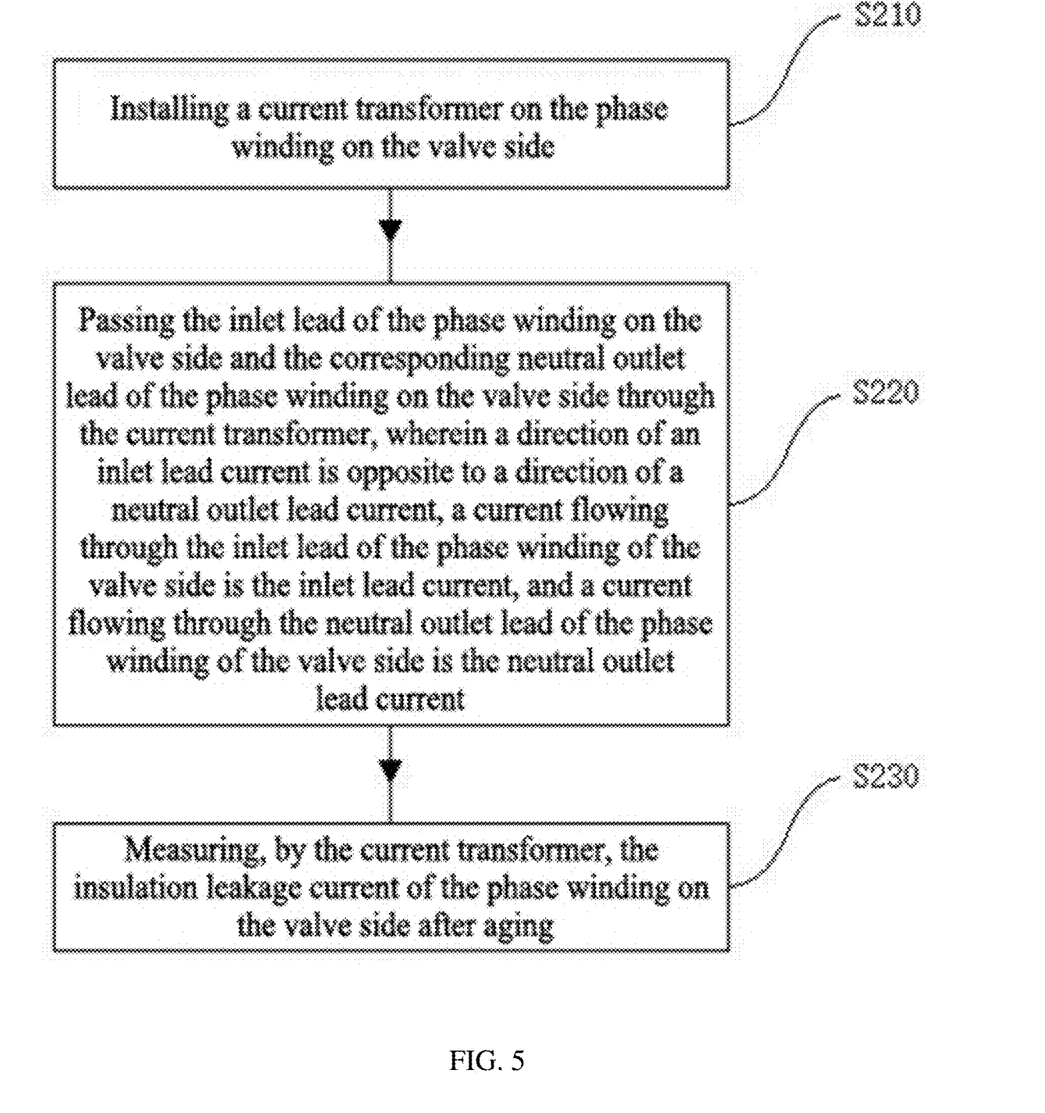
FIG. 5 is a flowchart of a method for measuring an insulation leakage current of an A-phase winding on the valve side provided by the present invention.

Further, as shown in FIGS. 4 and 5, the step of measuring the insulation leakage current of the certain phase winding on the valve side before aging includes the followings.

In step S210, a current transformer is installed on the certain phase winding on the valve side.

In step S220, the inlet lead of the phase winding on the valve side and the corresponding neutral outlet lead of the phase winding on the valve side pass through the current transformer. A direction of an inlet lead current is opposite to a direction of a neutral outlet lead current. A current flowing through the inlet lead of the phase winding of the valve side is the inlet lead current, and a current flowing through the neutral outlet lead of the phase winding of the valve side is the neutral outlet lead current.

In step S230, the current transformer measures the insulation leakage current of the phase winding on the valve side before aging.

Figure 6:
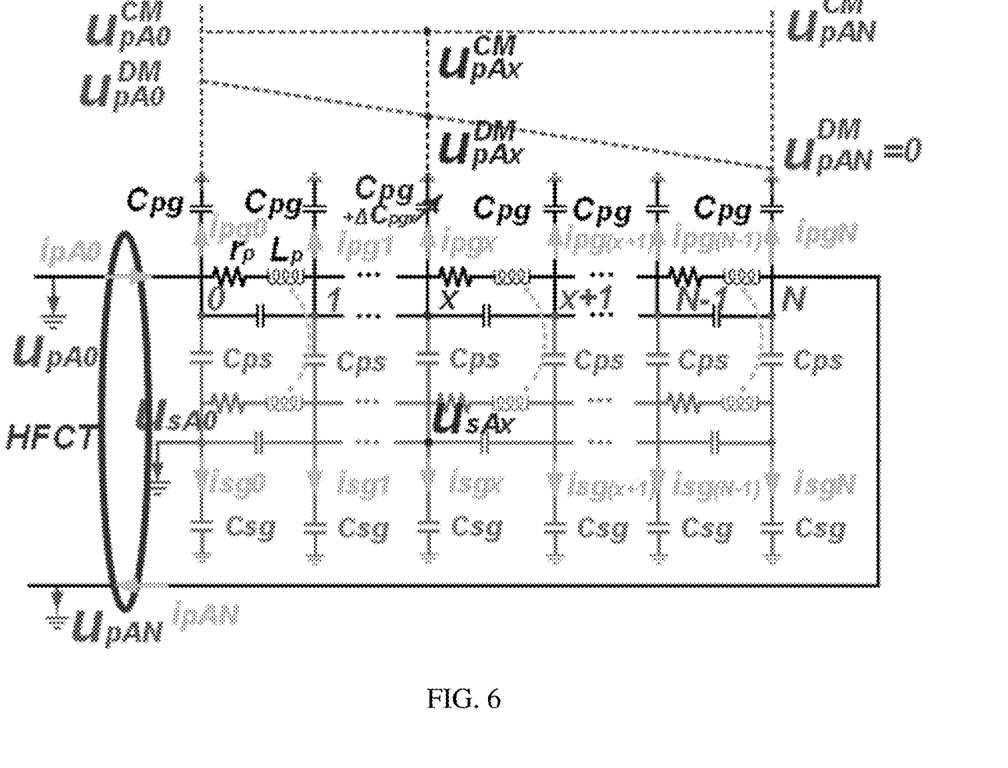
FIG. 6 is a schematic structure diagram of the A-phase winding on the valve side of the converter transformer provided by the present invention.

Further, according to a winding structure shown in FIG. 6, an expression for measuring the insulation leakage current of the phase winding on the valve side before aging is:

$$i_{leakA} = i_{pA0} - i_{pAN} = \sum_{x=0}^{N}(i_{pgx} + i_{sgx}), \quad (1)$$

$i_{leakA}$ is the insulation leakage current of the phase winding on the valve side before aging and is measured by the current transformer, $i_{pA0}$ is the inlet lead current before aging, $i_{pAN}$ is the neutral outlet lead current before aging, $i_{pgx}$ is a current flowing through an x-th ground-wall insulation branch circuit of the phase winding on the valve side before aging, $i_{sgx}$ is a current flowing through the x-th ground-wall insulation branch circuit of the phase winding on a grid side before aging, and N+1 is a total number of ground-wall insulation branch circuits of the phase winding.

In step S300, a common-mode component and a differential-mode component in the insulation leakage current of the phase winding on the valve side before aging are extracted, and a common-mode equivalent capacitance and a differential-mode equivalent capacitance before aging are calculated.

Specifically, the formula (1) is transformed to a frequency domain phasor mode, and a common-mode component expression and a differential-mode component expression of the insulation leakage current before aging measured by the current transformer are given respectively.

The common-mode component is extracted, and has the following expression of:

$$\begin{aligned} i_{leakA}^{CM} &= \omega^{CM} C_{pg} \sum_{x=0}^{N} \dot{U}_{pAx}^{CM} + \omega^{CM} C_{sg} \sum_{x=0}^{N} \dot{U}_{sAx}^{CM} \\ &= \omega^{CM}(N+1)\dot{U}_{pA0}^{CM}(C_{pg} + K^{CM}C_{sg}) \\ &\square \omega^{CM} \dot{U}_{pA0}^{CM} C_{eq}^{CM}, \end{aligned} \quad (2)$$

wherein
$\dot{i}_{leakA}^{CM}$ is the common-mode component in the insulation leakage current of the phase winding on the valve side before aging, $\omega^{CM}$ is a common-mode angular frequency, $C_{pg}$ is a capacitance component of a ground-wall insulation branch circuit of the phase winding on the valve side, $C_{sg}$ is a capacitance component of the ground-wall insulation branch circuit of the phase winding on the grid side, $\dot{U}_{pA0}^{CM}$ is a common-mode component of a phase-to-ground voltage at the inlet lead of the phase winding on the valve side before aging, $\dot{U}_{pAx}^{CM}$ is a common-mode component of a phaseto-ground voltage at a winding wire corresponding to the x-th ground-wall insulation branch circuit of the phase winding on the valve side before aging, $\dot{U}_{sAx}^{CM}$ is a common-mode component of the phase-to-ground voltage at the winding wire corresponding to the x-th ground-wall insulation branch circuit of the phase winding on the grid side before aging, N+1 is a total number of the ground-wall insulation branch circuits of the phase winding, $K^{CM}=1+C_{sg}/C_{ps}$, $C_{ps}$ is a capacitance component of an insulation branch circuit between a high-voltage winding and a low-voltage winding, and $C_{eq}^{CM}$ is the common-mode equivalent capacitance before aging.

The differential-mode component is extracted, and has the following expression of:

$$\begin{aligned} \dot{i}_{leakA}^{DM} &= \omega^{DM} C_{pg} \sum_{x=0}^{N} \dot{U}_{pAx}^{DM} + \omega^{DM} C_{sg} \sum_{x=0}^{N} \dot{U}_{sAx}^{DM} \\ &= \omega^{DM} \left[ (N+1)\dot{U}_{pA0}^{DM} - \frac{N(N+1)}{2} \frac{\dot{U}_{pA0}^{DM}}{N} \right] (C_{pg} + K^{DM} C_{sg}) \\ &= \omega^{DM} \frac{(N+1)\dot{U}_{pA0}^{DM}}{2} (C_{pg} + K^{DM} C_{sg}) \square \omega^{DM} \frac{\dot{U}_{pA0}^{DM}}{2} C_{eq}^{DM}, \end{aligned} \quad (3)$$

wherein
$\dot{I}_{leakA}^{DM}$ is the differential-mode component in the insulation leakage current of the phase winding on the valve side before aging, $\omega^{DM}$ is a differential-mode angular frequency, $\dot{U}_{pA0}^{DM}$ is a differential-mode component of the phase-to-ground voltage at the inlet lead of the phase winding on the valve side before aging, $\dot{U}_{pAx}^{DM}$ is a differential-mode component of the phase-to-ground voltage at the winding wire corresponding to the x-th ground-wall insulation branch circuit of the phase winding on the valve side before aging, $\dot{U}_{sAx}^{DM}$ is a differential-mode component of a phase-to-ground voltage at the winding wire corresponding to the x-th ground-wall insulation branch circuit of the phase winding on the grid side before aging, N+1 is a total number of the ground-wall insulation branch circuits of the phase winding, $K^{DM}$ is ratio of winding turns on the valve side to winding turns on the grid side of the converter transformer, and $C_{eq}^{DM}$ is the differential-mode equivalent capacitance before aging.

The common-mode equivalent capacitance $C_{eq}^{CM}$ and the differential-mode equivalent capacitance $C_{eq}^{DM}$ before aging are obtained according to the expressions (2) and (3) of the extracted common-mode and differential-mode components before aging.

The common-mode component and the differential-mode component in the insulation leakage current measured by the current transformer before aging are calculated through the above formulas, and a distribution rule of a common-mode frequency and a differential-mode frequency in the characteristic harmonic of the converter valve is analyzed.

In step S400, an insulation leakage current of the phase winding on the valve side after aging is measured.

Further, the step of measuring the insulation leakage current after aging includes the followings.

A current transformer is installed on the phase winding on the valve side.

The inlet lead of the phase winding on the valve side and the corresponding neutral outlet lead of the phase winding on the valve side pass through the current transformer. A direction of an inlet lead current is opposite to a direction of a neutral outlet lead current. A current flowing through the inlet lead of the phase winding of the valve side is the inlet lead current, and a current flowing through the neutral outlet lead of the phase winding of the valve side is the neutral outlet lead current.

The current transformer measures the insulation leakage current of the phase winding on the valve side after aging.

Further, an expression for measuring the insulation leakage current of the phase winding on the valve side after aging is:

$$\hat{i}_{leakA} = \hat{i}_{pA0} - \hat{i}_{pAN} = \sum_{x=0}^{N} (\hat{i}_{pgx} + \hat{i}_{sgx}). \quad (4)$$

In formula (4), $\hat{i}_{leak}^{A}$ is the insulation leakage current of the phase winding on the valve side after aging and is measured by the current transformer, $\hat{i}_{pA0}$ is the inlet lead current after aging, $\hat{i}_{pAN}$ is the neutral outlet lead current after aging, $\hat{i}_{pgx}$ is a current flowing through an x-th ground-wall insulation branch circuit of the phase winding on the valve side after aging, $\hat{i}_{sgx}$ is a current flowing through the x-th ground-wall insulation branch circuit of the phase winding on the grid side after aging, and N+1 is a total number of ground-wall insulation branch circuits of the phase winding.

In step S500, a common-mode component and a differential-mode component in the insulation leakage current of the phase winding on the valve side after aging are extracted, and a common-mode equivalent capacitance and a differential-mode equivalent capacitance after aging are calculated.

Further, in the step of extracting the common-mode component and the differential-mode component in the insulation leakage current of the phase winding on the valve side after aging, expressions of the common-mode component and the differential-mode component in the insulation leakage current after aging respectively are:

$$\begin{cases} \hat{i}_{leakA}^{CM} = i_{leakA}^{CM} + \omega^{CM} \dot{U}_{pAx}^{CM} \cdot \Delta C_{pgx} \\ \hat{i}_{leakA}^{DM} = i_{leakA}^{DM} + \omega^{DM} \left(1 - \frac{x}{N}\right) \dot{U}_{pAx}^{DM} \cdot \Delta C_{pgx} \end{cases}, \quad (5)$$

wherein
$\Delta C_{pgx}$ is a variation of capacitance of the x-th ground-wall insulation branch circuit of the phase winding on the valve side after aging, $\hat{I}_{leakA}^{CM}$ is the common-mode component in the insulation leakage current of the phase winding on the valve side after aging, and $\hat{I}_{leakA}^{DM}$ is the differential-mode component in the insulation leakage current of the phase winding on the valve side after aging.

Further, expressions for calculating common-mode and differential-mode equivalent capacitances after aging are:

$$\begin{cases} \hat{C}_{eq}^{CM} = \dfrac{\hat{I}_{leakA}^{CM}}{\omega^{CM} \dot{U}_{pA0}^{CM}} = C_{eq}^{CM} + \Delta C_{pgx} \\ \hat{C}_{eq}^{DM} = \dfrac{2\hat{I}_{leakA}^{DM}}{\omega^{DM} \dot{U}_{pA0}^{DM}} = C_{eq}^{DM} + 2\left(1 - \dfrac{X}{N}\right)\Delta C_{pgx} \end{cases}, \quad (6)$$

wherein
$\hat{C}_{eq}^{CM}$ is the common-mode equivalent capacitance after aging, and $\hat{C}_{eq}^{CM}$ is the differential-mode equivalent capacitance after aging.

According to formulas (5) and (6), a relationship between the aged common-mode and differential-mode equivalent capacitances and aging degrees can be obtained quantitatively. The common-mode equivalent capacitance can reflect the overall aging change amount in capacitance, but cannot reflect aging location information. The differential-mode equivalent capacitance is related to both the aging change amount in capacitance and the aging location.

In step S600, a ratio of a differential-mode equivalent capacitance difference value to a common-mode equivalent capacitance difference value is calculated according to (1) the difference value between the differential-mode equivalent capacitances before and after aging and (2) the difference value between the common-mode equivalent capacitances before and after aging, the ratio representing a ground-wall insulation aging location of the phase winding on the valve side.

Specifically, an expression for calculating the ratio of the differential-mode equivalent capacitance difference value to the common-mode equivalent capacitance difference value according to the difference value between the differential-mode equivalent capacitances before and after aging and the difference value between the common-mode equivalent capacitances before and after aging is:

$$\text{Ratio} = \frac{\tilde{C}_{eq}^{DM} - C_{eq}^{DM}}{\tilde{C}_{eq}^{CM} - C_{eq}^{CM}} = 2\left(1 - \frac{x}{N}\right). \quad (7)$$

The ground-wall insulation aging location of the phase winding on the valve side can be obtained according to the ratio in formula (7).

The present invention is further described below with reference to a specific embodiment.

Figure 7:
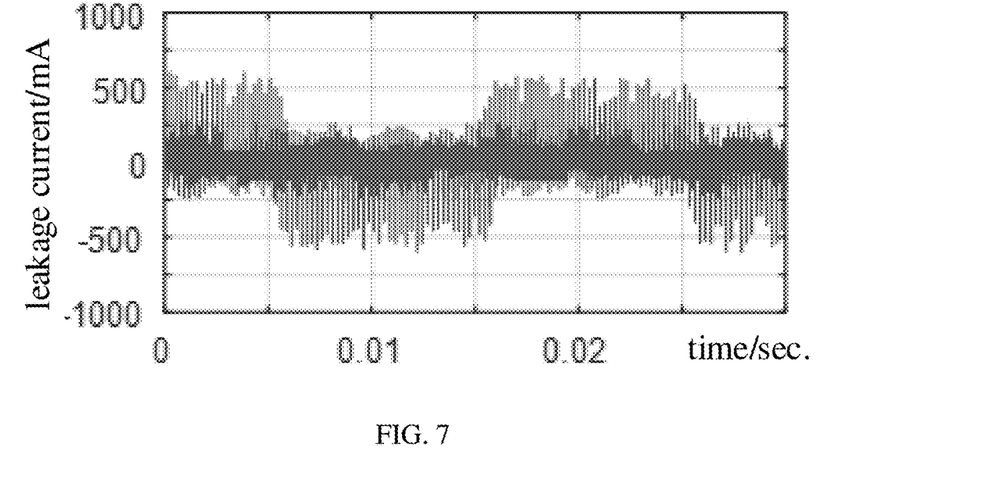
FIG. 7 is an experimental result verification chart of a measured insulation leakage current in a specific embodiment.

First, under a normal condition that insulation aging is not simulated, an insulation leakage current of the A-phase winding on the valve side is measured, as shown in FIG. 7. According to test results, the measured insulation leakage current does not include load current information, and the current measurement can be accurate to a milliamp, meeting the measurement requirement of the leakage current.

The N of the tested transformer is equal to 108. Ground-wall insulation aging experiments are performed at locations x=0, x=54, and x=105, respectively. A common-mode equivalent capacitance and a differential-mode equivalent capacitance are calculated on the basis of the measured phase-to-ground voltage and the leakage current. When the abscissa represents the common-mode equivalent capacitance and the ordinate represents the differential-mode equivalent capacitance, the obtained experimental results are shown in FIG. 8.

Figure 8:
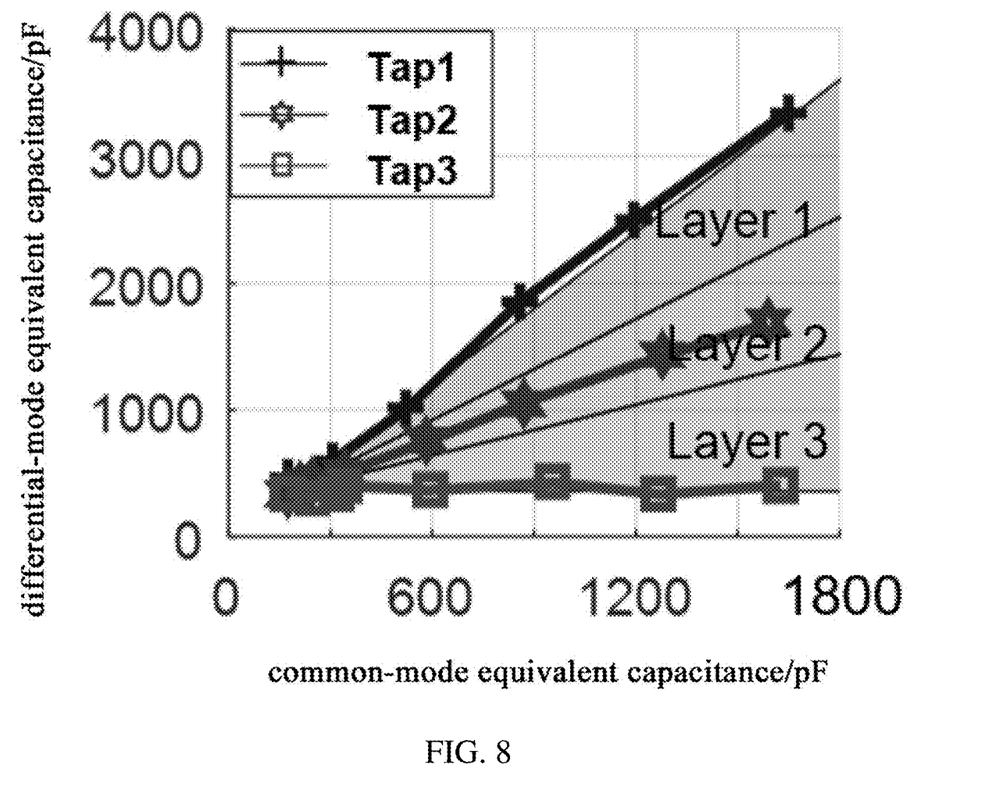
FIG. 8 is a result verification chart of a common-mode and differential-mode equivalent capacitances in the specific embodiment.

According to the experimental results in FIG. 8, it can be seen that the common-mode equivalent capacitance increases linearly with the increase of insulation aging degrees, and the insulation aging location represented by the slope of each curve is highly consistent with its theoretical value. Thus, the effectiveness of the method provided by the present invention is proven.

In summary, the present invention provides the ground-wall insulation aging monitoring and locating method for the converter transformer based on the characteristic harmonics of the converter valve. The method can achieve the following effects.

(1) The insulation condition of the converter transformer is monitored through the high-frequency characteristic harmonics generated by the converter valve. That is, by using the modulation strategy of the converter to control the switching actions, the generated characteristic harmonic voltage can act on the insulation of the converter transformer. Based on this, there is no need for an additional injection device. Thus, the non-intrusive monitoring purpose is achieved.

(2) The high-precision differential measurement of the ground-wall insulation leakage current of the converter transformer is achieved. That is, by simultaneously measuring leakage currents of the inlet and outlet leads of the winding, the insulation leakage current of this phase is acquired. Based on this, the effect of the load current of the tested transformer can be avoided. Thus, the milliamp-level measurement accuracy is reached.

(3) The ground-wall insulation aging location of the winding on the valve side of the converter transformer is located in combination with the calculated common-mode and differential-mode equivalent capacitances. That is, the common-mode and differential-mode equivalent capacitances are calculated according to the measured phase voltage and leakage current. The whole insulation aging degree is evaluated quantitatively through the common-mode equivalent capacitance. The insulation aging location is acquired through a slope between the common-mode equivalent capacitance and the differential-mode equivalent capacitance.

(4) A monitoring method based on characteristic harmonics by using the modulation strategy of the converter valve is provided. The characteristic harmonics are generated by the converter valve and directly act on the insulation of the converter transformer, thereby avoiding an additional injection device. The excitation voltage is directly measured by a voltage transformer installed at the inlet lead of the converter transformer, thereby avoiding an additional protecting circuit.

(5) A leakage current measurement method is provided. The neutral-lead connection of the three-phase windings on the valve side is changed; and a ground-wall insulation leakage current of each phase is obtained through a non-invasive differential high-precision current sensor. Since the leakage current does not include a load current, the result is unaffected by the load fluctuations in the power grid.

(6) An insulation monitoring method based on the common-mode and differential-mode equivalent capacitances is provided. That is, the common-mode equivalent capacitance can quantify the overall aging degree of the ground-wall insulation of the converter transformer. Then, the insulation aging can be located in combination with the differential-mode equivalent capacitance. Thus, the shortcoming of the existing techniques that the response curve cannot quantify and evaluate the insulation condition is solved.

It should be understood that the foregoing specific implementations of the present invention are only configured to exemplarily illustrate or explain the principle of the present invention, and do not constitute limitations to the present invention. Thus, any modification, equivalent replacement, improvement, etc. made without departing from the spirit and scope of the present invention should be encompassed by the protection scope of the present invention. In addition, the appended claims of the present invention are intended to cover all changes and modifications that fall within the scope and boundary of the appended claims, or equivalent forms of such scope and boundary.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A ground-wall insulation aging monitoring and locating method for a converter transformer, the method comprising the following steps:
   adjusting a neutral lead of three-phase windings on a valve side of the converter transformer;
   measuring an insulation leakage current of a certain phase winding on the valve side before aging;
   extracting a series of common-mode and differential-mode components of the insulation leakage current of the phase winding on the valve side before aging, and calculating the corresponding common-mode and differential-mode equivalent capacitances before aging;
   measuring an insulation leakage current of the phase winding on the valve side after aging;
   extracting a common-mode component and a differential-mode component in the insulation leakage current of the phase winding on the valve side after aging, and calculating a common-mode equivalent capacitance and a differential-mode equivalent capacitance after aging; and
   calculating a ratio of a differential-mode equivalent capacitance difference value to a common-mode equivalent capacitance difference value according to (1) the difference value between the differential-mode equivalent capacitances before and after aging and (2) the difference value between the common-mode equivalent capacitances before and after aging, the ratio representing a ground-wall insulation aging location of the phase winding on the valve side.

2. The method of claim 1, wherein the step of adjusting the neutral lead of the three-phase windings on the valve side of the converter transformer comprises parallelly arranging an inlet lead of a certain phase winding on the valve side of the converter transformer and a corresponding neutral outlet lead of the phase winding on the valve side.

3. The method of claim 2, wherein the step of measuring the insulation leakage current of the phase winding on the valve side after aging comprises:
   installing a current transformer on the phase winding on the valve side;
   passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding of the valve side is the inlet lead current, and a current flowing through the neutral outlet lead of the phase winding of the valve side is the neutral outlet lead current; and
   measuring, by the current transformer, the insulation leakage current of the phase winding on the valve side after aging.

4. The method of claim 2, wherein the step of measuring the insulation leakage current of the certain phase winding on the valve side before aging comprises:
   installing a current transformer on the certain phase winding on the valve side;
   passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding on the valve side is the inlet lead current, and a current flowing through the neutral outlet lead of the phase winding on the valve side is the neutral outlet lead current; and
   measuring, by the current transformer, the insulation leakage current of the phase winding on the valve side before aging.

5. The method of claim 4, wherein the step of measuring the insulation leakage current of the phase winding on the valve side after aging comprises:
   installing a current transformer on the phase winding on the valve side;
   passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding of the valve side is the inlet lead current, and a current flowing through the neutral outlet lead of the phase winding of the valve side is the neutral outlet lead current; and
   measuring, by the current transformer, the insulation leakage current of the phase winding on the valve side after aging.

6. The method of claim 4, wherein an expression for measuring the insulation leakage current of the phase winding on the valve side before aging is:

$$i_{leakA} = i_{pA0} - i_{pAN} = \sum_{x=0}^{N} (i_{pgx} + i_{sgx}), \quad (1)$$

wherein
$i_{leakA}$ is the insulation leakage current of the phase winding on the valve side before aging and is measured by the current transformer, $i_{pA0}$ is the inlet lead current before aging, $i_{pAN}$ is the neutral outlet lead current before aging, $i_{pgx}$ is a current flowing through an x-th ground-wall insulation branch circuit of the phase winding on the valve side before aging, $i_{sgx}$ is a current flowing through the x-th ground-wall insulation branch circuit of the phase winding on a grid side before aging, and N+1 is a total number of ground-wall insulation branch circuits of the phase winding.

7. The method of claim 6, wherein the step of measuring the insulation leakage current of the phase winding on the valve side after aging comprises:
   installing a current transformer on the phase winding on the valve side;

passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding of the valve side is the inlet lead current, and a current flowing through the neutral outlet lead of the phase winding of the valve side is the neutral outlet lead current; and measuring, by the current transformer, the insulation leakage current of the phase winding on the valve side after aging.

8. The method of claim 6, wherein extracting the common-mode component and the differential-mode component in the insulation leakage current of the phase winding on the valve side before aging and calculating the common-mode equivalent capacitance and the differential-mode equivalent capacitance before aging comprise:

extracting the common-mode component having an expression of:

$$i_{leakA}^{CM} = \omega^{CM} C_{pg} \sum_{x=0}^{N} \dot{U}_{pAx}^{CM} + \omega^{CM} C_{sg} \sum_{x=0}^{N} \dot{U}_{sAx}^{CM} \quad (2)$$
$$= \omega^{CM}(N+1)\dot{U}_{pA0}^{CM}(C_{pg} + K^{CM}C_{sg})$$
$$\square \omega^{CM} \dot{U}_{pA0}^{CM} C_{eq}^{CM},$$

wherein
$\dot{i}_{leakA}^{CM}$ is the common-mode component in the insulation leakage current of the phase winding on the valve side before aging, $\omega^{CM}$ is a common-mode angular frequency, $C_{pg}$ is a capacitance component of a ground-wall insulation branch circuit of the phase winding on the valve side, $C_{sg}$ is a capacitance component of the ground-wall insulation branch circuit of the phase winding on the grid side, $\dot{U}_{pA0}^{CM}$ is a common-mode component of a phase-to-ground voltage at the inlet lead of the phase winding on the valve side before aging, $\dot{U}_{pAx}^{CM}$ is a common-mode component of a phase-to-ground voltage at a winding wire corresponding to the x-th ground-wall insulation branch circuit of the phase winding on the valve side before aging, $\dot{U}_{sAx}^{CM}$ is a common-mode component of the phase-to-ground voltage at the winding wire corresponding to the x-th ground-wall insulation branch circuit of the phase winding on the grid side before aging, N+1 is a total number of the ground-wall insulation branch circuits of the phase winding, $K^{CM}=1+C_{sg}/C_{ps}$ $C_{ps}$ is a capacitance component of an insulation branch circuit between a high-voltage winding and a low-voltage winding, and $C_{eq}^{CM}$ is the common-mode equivalent capacitance before aging;

extracting the differential-mode component having an expression of:

$$i_{leakA}^{DM} = \omega^{DM} C_{pg} \sum_{x=0}^{N} \dot{U}_{pAx}^{DM} + \omega^{DM} C_{sg} \sum_{x=0}^{N} \dot{U}_{sAx}^{DM} \quad (3)$$
$$= \omega^{DM}\left[(N+1)\dot{U}_{pA0}^{DM} - \frac{N(N+1)}{2}\frac{\dot{U}_{pA0}^{DM}}{N}\right](C_{pg}+K^{DM}C_{sg})$$
$$= \omega^{DM}\frac{(N+1)\dot{U}_{pA0}^{DM}}{2}(C_{pg}+K^{DM}C_{sg})\square\omega^{DM}\frac{\dot{U}_{pA0}^{DM}}{2}C_{eq}^{DM},$$

wherein
$\dot{i}_{leakA}^{DM}$ is the differential-mode component in the insulation leakage current of the phase winding on the valve side before aging, $\omega^{DM}$ is a differential-mode angular frequency, $\dot{U}_{pA0}^{DM}$ is a differential-mode component of the phase-to-ground voltage at the inlet lead of the phase winding on the valve side before aging, $\dot{U}_{pAx}^{DM}$ is a differential-mode component of the phase-to-ground voltage at the winding wire corresponding to the x-th ground-wall insulation branch circuit of the phase winding on the valve side before aging, $\dot{U}_{sAx}^{DM}$ is a differential-mode component of a phase-to-ground voltage at the winding wire corresponding to the x-th ground-wall insulation branch circuit of the phase winding on the grid side before aging, N+1 is a total number of the ground-wall insulation branch circuits of the phase winding, $K^{DM}$ is ratio of winding turns on the valve side to winding turns on the grid side of the converter transformer, and $C_{eq}^{DM}$ is the differential-mode equivalent capacitance before aging; and obtaining the common-mode equivalent capacitance $C_{eq}^{CM}$ and the differential-mode equivalent capacitance $C_{eq}^{DM}$ before aging according to the expressions (2) and (3) of the extracted common-mode and differential-mode components in the insulation leakage current of the phase winding on the valve side before aging.

9. The method of claim 8, wherein the step of measuring the insulation leakage current of the phase winding on the valve side after aging comprises:

installing a current transformer on the phase winding on the valve side;

passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding of the valve side is the inlet lead current, and a current flowing through the neutral outlet lead of the phase winding of the valve side is the neutral outlet lead current; and measuring, by the current transformer, the insulation leakage current of the phase winding on the valve side after aging.

10. The method of claim 1, wherein the step of measuring the insulation leakage current of the phase winding on the valve side after aging comprises:

installing a current transformer on the phase winding on the valve side;

passing the inlet lead of the phase winding on the valve side and the corresponding neutral outlet lead of the phase winding on the valve side through the current transformer, wherein a direction of an inlet lead current is opposite to a direction of a neutral outlet lead current, a current flowing through the inlet lead of the phase winding of the valve side is the inlet lead current, and a current flowing through the neutral outlet lead of the phase winding of the valve side is the neutral outlet lead current; and measuring, by the current transformer, the insulation leakage current of the phase winding on the valve side after aging.

11. The method of claim 10, wherein an expression for measuring the insulation leakage current of the phase winding on the valve side after aging is:

$$\hat{i}_{leakA} = \hat{i}_{pA0} - \hat{i}_{pAN} = \sum_{x=0}^{N}(\hat{i}_{pgx} + \hat{i}_{sgx}), \quad (4)$$

wherein $\hat{i}_{leakA}$ is the insulation leakage current of the phase winding on the valve side after aging and is measured by the current transformer, $\hat{i}_{pA0}$ is the inlet lead current after aging, $\hat{i}_{pAN}$ is the neutral outlet lead current after aging, $\hat{i}_{pgx}$ is a current flowing through an x-th ground-wall insulation branch circuit of the phase winding on the valve side after aging, $\hat{i}_{sgx}$ is a current flowing through the x-th ground-wall insulation branch circuit of the phase winding on the grid side after aging, and N+1 is a total number of ground-wall insulation branch circuits of the phase winding.

12. The method of claim 11, wherein in the step of extracting the common-mode component and the differential-mode component in the insulation leakage current of the phase winding on the valve side after aging,
expressions of the common-mode component and the differential-mode component in the insulation leakage current after aging respectively are:

$$\begin{cases} \hat{i}_{leakA}^{CM} = i_{leakA}^{CM} + \omega^{CM} \dot{U}_{pAx}^{CM} \cdot \Delta C_{pgx} \\ \hat{i}_{leakA}^{DM} = i_{leakA}^{DM} + \omega^{DM}\left(1 - \frac{x}{N}\right)\dot{U}_{pAx}^{DM} \cdot \Delta C_{pgx} \end{cases}, \quad (5)$$

wherein $\Delta C_{pgx}$ is a variation of capacitance of the x-th ground-wall insulation branch circuit of the phase winding on the valve side after aging, $\hat{i}_{leakA}^{CM}$ is the common-mode component in the insulation leakage current of the phase winding on the valve side after aging, and $\hat{i}_{leakA}^{DM}$ is the differential-mode component in the insulation leakage current of the phase winding on the valve side after aging.

13. The method of claim 12, wherein expressions for calculating common-mode and differential-mode equivalent capacitances after aging are:

$$\begin{cases} \hat{C}_{eq}^{CM} = \frac{\hat{I}_{leakA}^{CM}}{\omega^{CM} \dot{U}_{pA0}^{CM}} = C_{eq}^{CM} + \Delta C_{pgx} \\ \hat{C}_{eq}^{DM} = \frac{2\hat{I}_{leakA}^{DM}}{\omega^{DM} \dot{U}_{pA0}^{DM}} = C_{eq}^{DM} + 2\left(1 - \frac{X}{N}\right)\Delta C_{pgx} \end{cases}, \quad (6)$$

wherein $\hat{C}_{eq}^{CM}$ is the common-mode equivalent capacitance after aging, and $\hat{C}_{eq}^{DM}$ is the differential-mode equivalent capacitance after aging.

14. The method of claim 13, wherein an expression for calculating the ratio of the differential-mode equivalent capacitance difference value to the common-mode equivalent capacitance difference value according to (1) the calculated difference value between the differential-mode equivalent capacitances before and after aging and (2) the calculated difference value between the common-mode equivalent capacitances before and after aging is:

$$\text{Ratio} = \frac{\hat{C}_{eq}^{DM} - C_{eq}^{DM}}{\hat{C}_{eq}^{CM} - C_{eq}^{CM}} = 2\left(1 - \frac{x}{N}\right), \quad (7)$$

wherein a ground-wall insulation aging location of the phase winding on the valve side is obtained according to the ratio.

* * * * *